United States Patent [19]
Hashimoto

[11] Patent Number: 6,115,323
[45] Date of Patent: Sep. 5, 2000

[54] SEMICONDUCTOR MEMORY DEVICE FOR STORING DATA WITH EFFICIENT PAGE ACCESS OF DATA LYING IN A DIAGONAL LINE OF A TWO-DIMENSIONAL DATA CONSTRUCTION

[75] Inventor: Masashi Hashimoto, Tsukuba, Japan

[73] Assignee: Texas Instruments Incorporated, Dallas, Tex.

[21] Appl. No.: 09/185,685

[22] Filed: Nov. 4, 1998

[30] Foreign Application Priority Data

Nov. 5, 1997 [JP] Japan ................................. 9-302842

[51] Int. Cl.⁷ ..................................................... G11C 8/00
[52] U.S. Cl. ................................... 365/238.5; 365/230.06
[58] Field of Search ................................. 365/238.5, 235, 365/230.01, 231, 230.06

[56] References Cited

U.S. PATENT DOCUMENTS 5,586,196  12/1996  Sussman .................................. 382/114
5,638,128   6/1997  Hoogenboom et al. ................. 348/416
5,675,363  10/1997  Omori ..................................... 345/200
5,872,869   2/1999  Shimizu et al. ........................ 382/282

Primary Examiner—David Nelms
Assistant Examiner—Thong Le
Attorney, Agent, or Firm—William B. Kempler; Frederick J. Telecky, Jr.

[57] ABSTRACT

The objective of the invention is to conduct access of image data in the diagonal direction at high-speed by using the page mode.

The memory region is divided into four memory arrays ($15_{-1}$ to $15_{-4}$), and shifters ($13_{-1}$ to $13_{-4}$) [sic: ($14_{-1}$ to $14_{-4}$)] are provided that can shift the page address by one address in relation to each memory array. The image data are divided into sub-blocks of 4×4, 4 data items for the vertical correction are stored in the same memory array, and the page addresses for the sub-blocks connected in the horizontal direction are stored so as to be consecutive. In the case of accessing the data in the diagonal direction, when the data straddle adjacent blocks 4 at a time from the top, the page address is shifted by a shifter for the memory array containing that straddled column. In this way even in accessing the diagonal direction, 4 units of data are always obtained for a 1-page access, and data scanning of the diagonal direction by the page mode becomes possible.

7 Claims, 7 Drawing Sheets

SEMICONDUCTOR MEMORY DEVICE FOR STORING DATA WITH EFFICIENT PAGE ACCESS OF DATA LYING IN A DIAGONAL LINE OF A TWO-DIMENSIONAL DATA CONSTRUCTION

FIELD OF THE INVENTION

This invention relates to a semiconductor device in which, when data having a two-dimensional construction such as image data is stored, the data for the diagonal direction of that stored data can be quickly accessed.

BACKGROUND OF THE INVENTION

Here, an explanation is given in regard to the normally used access method for data of a semiconductor memory device.

In a semiconductor memory device such as a DRAM (Dynamic Random Access Memory), ordinarily in the chip section, the memory elements are two-dimensionally arranged on a silicon flat surface. If one of the coordinates showing that two-dimensional arrangement is made the Xi address and the other the Yi address, a specific word line is first selected by means of the Xi address. As a result all of the memory elements connected to that word line are accessed at the same time by sense amplifiers of the same number as the memory elements. By means of the Yi address, only the desired data are selected from among that accessed data, then output. The time required for one series of operations—from the selection of a word line corresponding to this Xi address to the output of the sense amplifier of the data for the memory elements—is three times that required in the selection of the desired data corresponding to the succeeding Yi address.

Thus, in order to raise the data access efficiency in the DRAM, it is frequently the case that the Yi address selection mode (page mode) is made usable in which the operation is completed in a short time, in other words, a short cycle time. The page mode conducts the access of an Xi address in a fixed address sequence, to the extent possible without setting both the Xi address and the Yi address at each operating cycle as different values.

Also, in the DRAM, when viewed from the access operation for the data in which the Xi address is precharged at each change, a needless operation must be done; this is also linked to a lowering of the data access efficiency, but the number of times needless operation is performed can also be reduced using the page mode.

Also, there are instances in which an X-Y address applied to the chip from an external section and this Xi-Yi address corresponding to the memory element arrangement inside the chip do not match. Of course, the X-Y address and the Xi-Yi address correspond one-to-one, the input X-Y address is converted to a suitable Xi-Yi address, and a specific memory element is addressed.

As for the selection of the page in the above-mentioned page mode, ordinarily in order to conduct it by means of the X address, the X address is also called the page address. Also, in order to realize this page access operation without being in an unfavorable situation, the Xi address is set the same as the X address or a multiple integer of that.

However, if a page mode such as that mentioned above is only used normally, the data can be accessed quickly with good efficiency in the X address direction, but in the Y address direction the access of the data cannot be done at high speed and with good efficiency.

In order to solve this unsatisfactory problem, it is frequently the case that a method that remaps the data within one page to a two-dimensional plane surface is used.

For example, it is made 16 units of data within one page. It is expected that this is made a construction wherein a single data item within 16 units is selected by means of a 4-bit Y address, but this is not viewed as a space stipulated by an address of 4 bits, but is viewed as data of a space of, for example, 2 bits in the horizontal direction (H address) and 2 bits in the vertical direction (V address). In other words, as shown in FIG. 10, the 4×4 block is stored as the data for one page. If done in this manner, up to 4 data items can be accessed efficiently and with high-speed in both the H direction and the V direction.

With this method, the continuously accessible maximum length data number for one direction becomes [drops] from 16 to 4, and may be thought of as not increasing the efficiency, but actually it is frequently the case that the system efficiency is improved. For example, in the error correction for a DVD (Digital Video Disk), the data block is read out in the horizontal direction (PI) and the vertical direction (PO), and the process of error correction is executed in the respective directions, but this process is conducted in a parallel pipeline. Thus, if a large difference is created in the access time from the memory for the data in the horizontal direction and the vertical direction, a disorder is generated in the pipeline process; as a result, the system efficiency is lowered. However, if a remapping such as was mentioned above is conducted, since the readout can be done at the same speed for either the horizontal direction or the vertical direction, in such a system that conducts the parallel pipeline process, an improvement of the efficiency can be anticipated.

However, according to a method such as mentioned above, accessing of the data could be done with high efficiency in the X and Y directions, but in the diagonal direction of the X-Y address space, it was the case that the accessing of the data could not be done at high-speed with good efficiency.

As shown in FIG. 11, if it is the diagonal line (a) such as that beginning from the apex of the 4×4 block, the 4 units of data can be obtained based on a single page access in the same manner as the access of the data in the X and Y directions, but in the case in which it is offset from the apex of the 4×4 block, for example, of diagonal line (b), the data that can be obtained from a single block, in other words, the page access for one time, consists of only 2 units, and unless a page access for two times the number of the data access in the diagonal line (A) and the X and Y directions is performed, the diagonal line cannot be pursued.

Therefore, for example, in a case such as conducting the error correction for a CD-ROM (Compact Disk ROM), the data block is read out in the vertical direction and the diagonal direction (PO), and in the case of conducting a process such as executing the error correction in the respective directions, the data cannot be accessed with good efficiency at high-speed with a DRAM having a construction like those used until now.

Therefore, the objective of this invention is to offer a semiconductor memory device in which, when storing data having a two-dimensional construction, accessing of that stored data can be conducted at high speed in a diagonal direction.

SUMMARY OF THE INVENTION

According to one aspect of the invention the memory space is divided into a number of data sections of sub-blocks in the vertical and horizontal directions, with a shifted part of a single page being made accessible in relation to the original page address at each of those divided memory spaces. In this way, it is made so as to easily conduct an access such that only data that are regularly offset by one page become necessary, so as to access the data on a diagonal line.

Therefore, the semiconductor memory device of another aspect of this invention has N units of memory array having a predetermined number of pages in which storage elements are arranged that enable the storage of essentially M units of data for one page address, as well as a page selecting means that, based on prescribed shift information that is input, selects a page showing the page address that is input at each of the above-mentioned N units of memory array, or any on e of said page addresses and a page separated from the prescribed address, and makes said page for the corresponding above-mentioned memory array effective, and a data selecting means to which the above-mentioned page that was made effective for the above-mentioned N units of memory are output, selecting the desired data from M units times N units of data that are stored in said page.

Preferably, the above-mentioned page selection means has a decoder that decodes the input page address and makes effective the word line that makes the page showing said address effective. It should also have word-line shift means that are respectively provided for optional memory arrays of the above-mentioned N units of memory arrays, and which, based on the above-mentioned input prescribed shift information, shift the above-mentioned effective word line to the word line that makes effective the page before or following the above-mentioned address.

Also, the semiconductor memory device of a further aspect of this invention has N units of memory array having the prescribed number of pages in which storage elements are arranged that enable the storage of essentially M units of data for a single page address, with the data having a two-dimensional construction and being divided into sub-blocks having a two-dimensional construction and having M units times units of data. The above-mentioned sub-blocks connected in a first direction are sequentially stored in the above-mentioned pages in which the addresses are consecutive; for each sub-block, M units of column data that are consecutive in the second direction become the same page of the same array, those N units of the above-mentioned column data become the page for the same address for N units of memory array, and the above-mentioned column data of the same position of each sub-block are stored so as to become the same memory array. The device also has a page selection means that, based on the information related to an address showing the desired data that was input, and the desired diagonal line of the scanning object that was input, selects a page having the data of the sub-block containing the above-mentioned desired data at each of the above-mentioned N units of memory array so as to make the data contained in the above-mentioned desired diagonal line N units selectable, or either of the pages preceding or following said page, and makes said page of each of the above-mentioned memory arrays effective, as well as having a data selection means that selects N units of data contained in the above-mentioned desired diagonal line from M units times N units of data stored in said pages that were output from the above-mentioned page of the above-mentioned N units of memory array that was made effective.

Yet another aspect of the invention is a semiconductor memory device wherein the M number of data of the above-mentioned second direction of the above-mentioned sub-block is the same as the N number of data of the above-mentioned first direction, with the optional two-dimensional data being stored and the data for each N unit being accessible in the page mode even in the diagonal direction.

REFERENCE NUMERALS AND SYMBOLS AS SHOWN IN THE DRAWINGS

Figure 1:
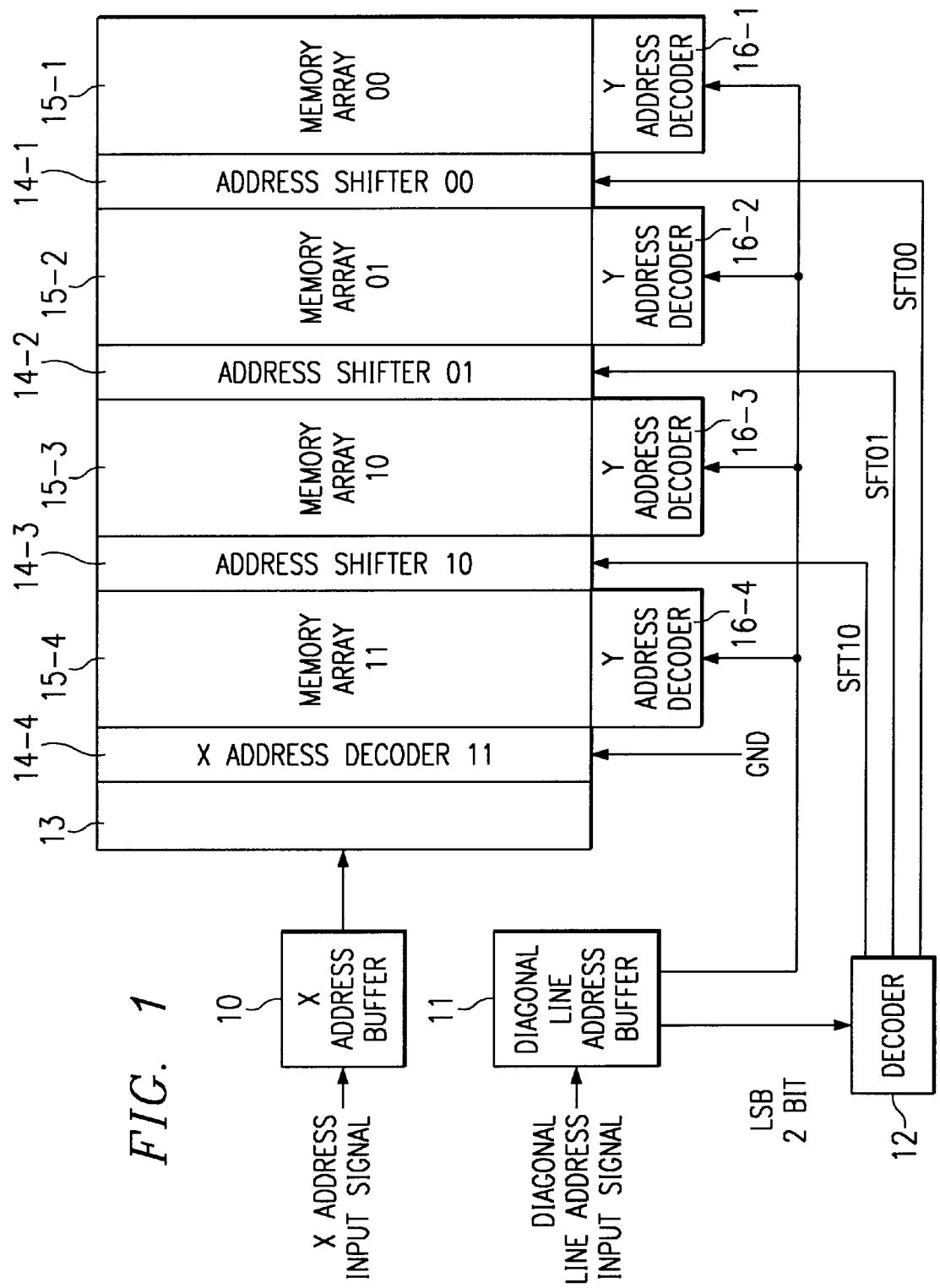
FIG. 1 is a block diagram showing the construction of the principal components of a DRAM of a configuration of one embodiment of this invention.

In the drawings, 1 represents DRAM, 10 X address buffer, 11 Diagonal line address buffer, 12 Decoder, 13 X address decoder, 14 Address shifter, 15 Memory array, 16 Y address decoder

DESCRIPTION OF EMBODIMENTS

The configuration of one embodiment of a semiconductor memory device of this invention is explained in reference to FIGS. 1 to 8.

In the configuration of this embodiment, a DRAM is exemplified which can record the image data wherein each pixel is specified by two-dimensional coordinates so as to be suitable in reading out in the order of the diagonal direction for providing processes such as applying codes, for example, ECC (Error Checking and Correcting) codes.

FIG. 1 is a block diagram showing the construction of the principal components related to this invention for its DRAM.

The DRAM 1 has an X address buffer 10, a diagonal address buffer 11, a decoder 12, an X address decoder 13, a first to fourth address shifter $14_{-1}$ to $14_{-4}$, a first to fourth memory array $15_{-1}$ to $15_{-4}$, and a first to fourth Y address decoder $16_{-1}$ to $16_{-4}$.

First, an explanation is given in regard to the method of recording the image data to the first to fourth memory arrays $15_{-1}$ to $15_{-4}$.

The respective first to fourth memory arrays $15_{-1}$ to $15_{-4}$ are those in which four memory elements for one word line are connected, with 16 bits of data being accessed by one page address for the entire body of the first to fourth memory arrays $15_{-1}$ to $15_{-4}$.

Figure 2:
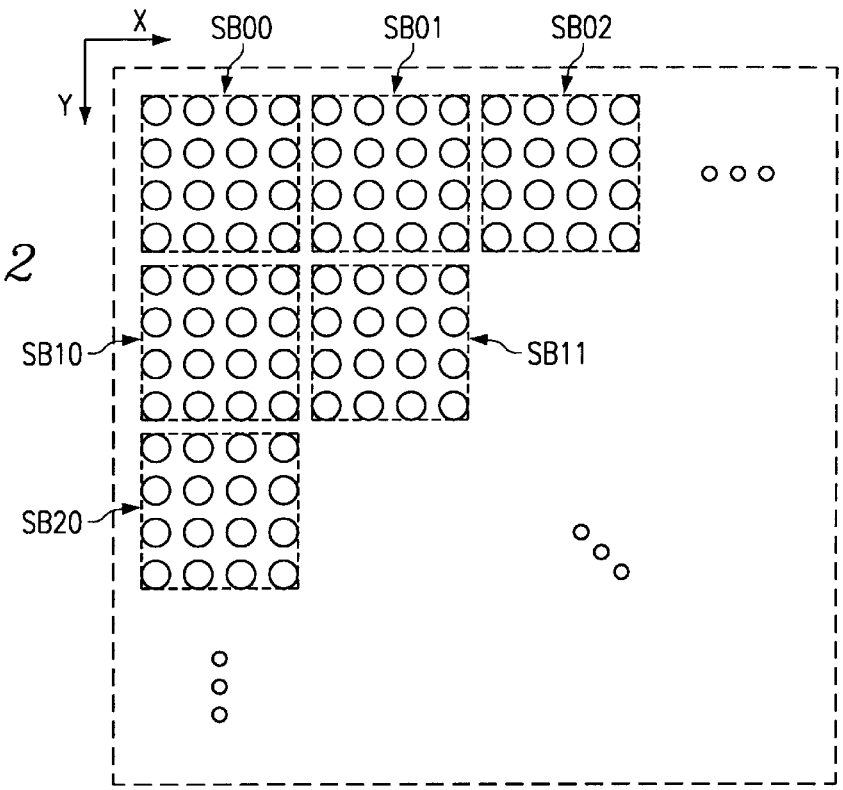
FIG. 2 is a diagram for explaining a sub-block that, at the time of storing image data in the DRAM shown in FIG. 1, is stored as the same page.

The XY two-dimensional space data written into the DRAM 1, as shown in FIG. 2, is divided into the 4×4 sub-blocks (SB00, SB01, . . . , SBnn), the 16 data items of these sub-blocks are used as the data for the same page and are recorded in the first to fourth memory arrays ($15_{-1}$ to $15_{-4}$).

Specifically, first, the first column of sub-blocks (SB00, SB01, . . . ) aligned in the X direction on the XY space are written in the sequence of the connected page addresses. Next, the second column and later sub-blocks (SB10, SB11, . . . ) are written in the sequence of the connected page addresses in the same manner. Afterwards, it is the same in regard to the third column and after.

Figure 3:
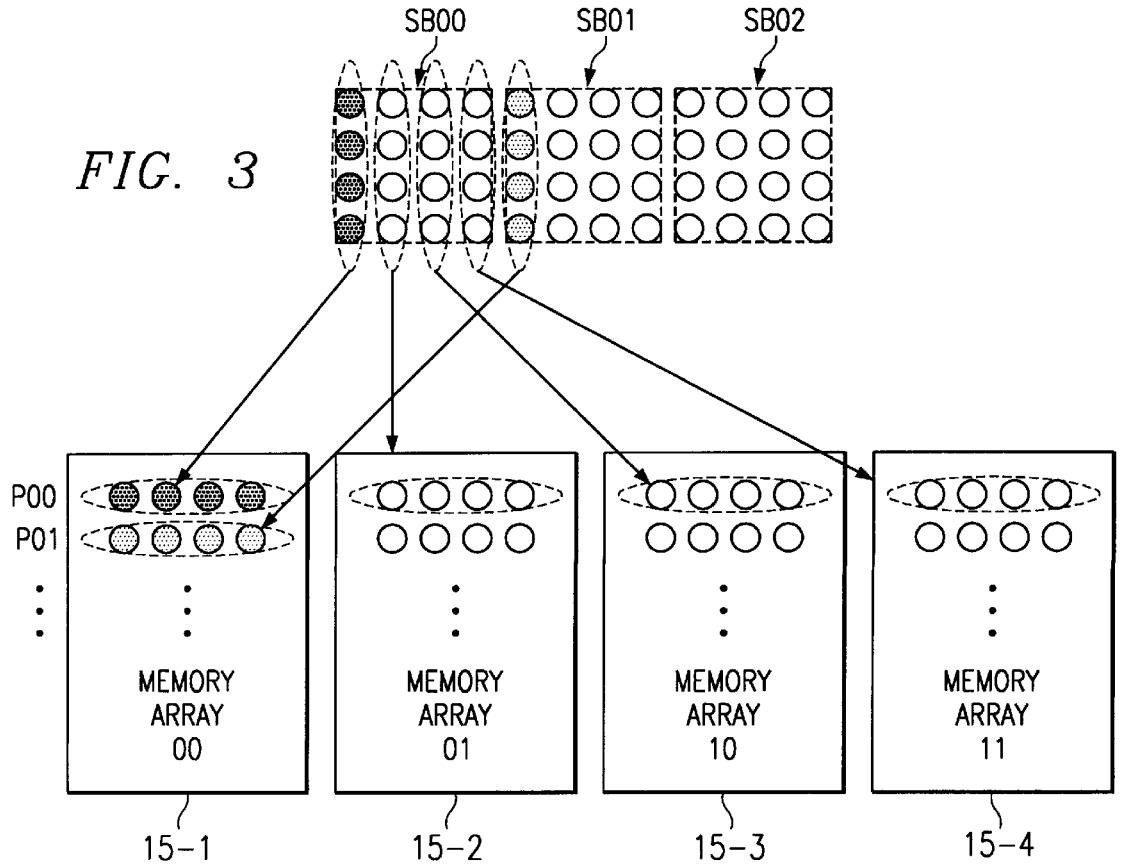
FIG. 3 is a diagram for explaining the method that stores the data of the sub-block shown in FIG. 2 in the first to fourth memory arrays of the DRAM shown in FIG. 1.

Also, at the time of recording each sub-block, as shown in FIG. 3, each data item for the column in the Y direction of each sub-block is recorded in the same memory array (15-i) (i=1 to 4), and the items in the column for the Y direction that are in the same position in each sub-block are processed so as to be recorded in the same memory array (15-i).

In other words, the data of the Y direction first column for each sub-block (SB00 to SBnn) are recorded in the first memory array ($15_{-1}$), the data of the Y direction second column are recorded in the second memory array ($15_{-2}$), the data of the Y direction third column are recorded in the third memory array ($15_{-3}$), and the data of the Y direction for the column in the memory array ($15_{-4}$).

Next, an explanation is given in regard to the construction of each main section of the DRAM 1.

The X address buffer 10 is a buffer in which the input X addresses (page addresses) are temporarily stored.

The diagonal line address buffer 11 is a buffer that temporarily stores the input diagonal line address.

Here, in the XY space such as shown in FIG. 2, the diagonal line (D) (m, n) is one that uses X=m, Y=n as the starting point, with all the diagonal lines extending from the upper left to the lower right. For simplification, if it is taken to be n=0, the m of a diagonal line defined in this manner is the address that defines the diagonal line, is input as the diagonal line address, and is stored in the diagonal line address buffer 11. Except for the LSB 2 bits of this m, the upper ranking bit shows x of the sub-block (SBx, and the LSB 2 bits show the number of data across the sub-block; to state it another way, it shows the number of data read out from the sub-block (SB (x+1)) of the right adjacent sub-block designated by the page address.

The decoder 12 decodes the lower ranking 2 bits of the diagonal line address, which is the number of data read out from the sub-block (SB (x+1)) of the adjacent right sub-block designated by the page address input from the diagonal line address buffer 11, and generates the shift signals (SFT00 to SFT10) that are input to the first to third address shifters ($14_{-1}$ to $14_{-3}$). The relationship between the signal for the lower ranking 2 bits of the input diagonal line address and the generated shift signal is shown in Table I.

TABLE 1

| Bit No. | | Shift signal | | |
|---|---|---|---|---|
| 1 | 0 (LSB) | SFT00 | SFT01 | SFT11 |
| 0 | 0 | 0 | 0 | 0 |
| 0 | 1 | 1 | 0 | 0 |
| 1 | 0 | 0 | 1 | 0 |
| 1 | 1 | 0 | 0 | 1 |

In other words, if the lower ranking two bits for the diagonal line address are 00, the data of the sub-block on the adjacent right side need not be read out and none of the shift signals (SFT00 to SFT11) are generated. If the lower ranking 2 bits of the diagonal line address are 01, that diagonal line begins at the second column from the left of the sub-block, and the fourth data items become the data for the adjacent sub-block. Therefore, in order to read out one unit of data from the sub-block of the adjacent right side, the shift signal (SFT00) is made 1. In the same manner, when the lower ranking 2 bits of the diagonal line address are 10 and 11, since the data of the sub-block of the adjacent right side become two units or three units that are read out, the shift signals (SFT01) and (SFT11) respectively become 1.

The X address decoder 13 decodes the X address supplied from the X address buffer 10, and activates corresponding word line.

The first to the fourth address shifters $14_{-1}$ to $14_{-4}$ are the circuits used to shift the page selection signal (word line) that is made active in the first to fourth memory arrays $15_{-1}$ to $15_{-4}$, respectively, based on the shift signals (SFT00 to SFT10) that are input to each address shifter 14-i (i=1 to 4).

Figure 4:
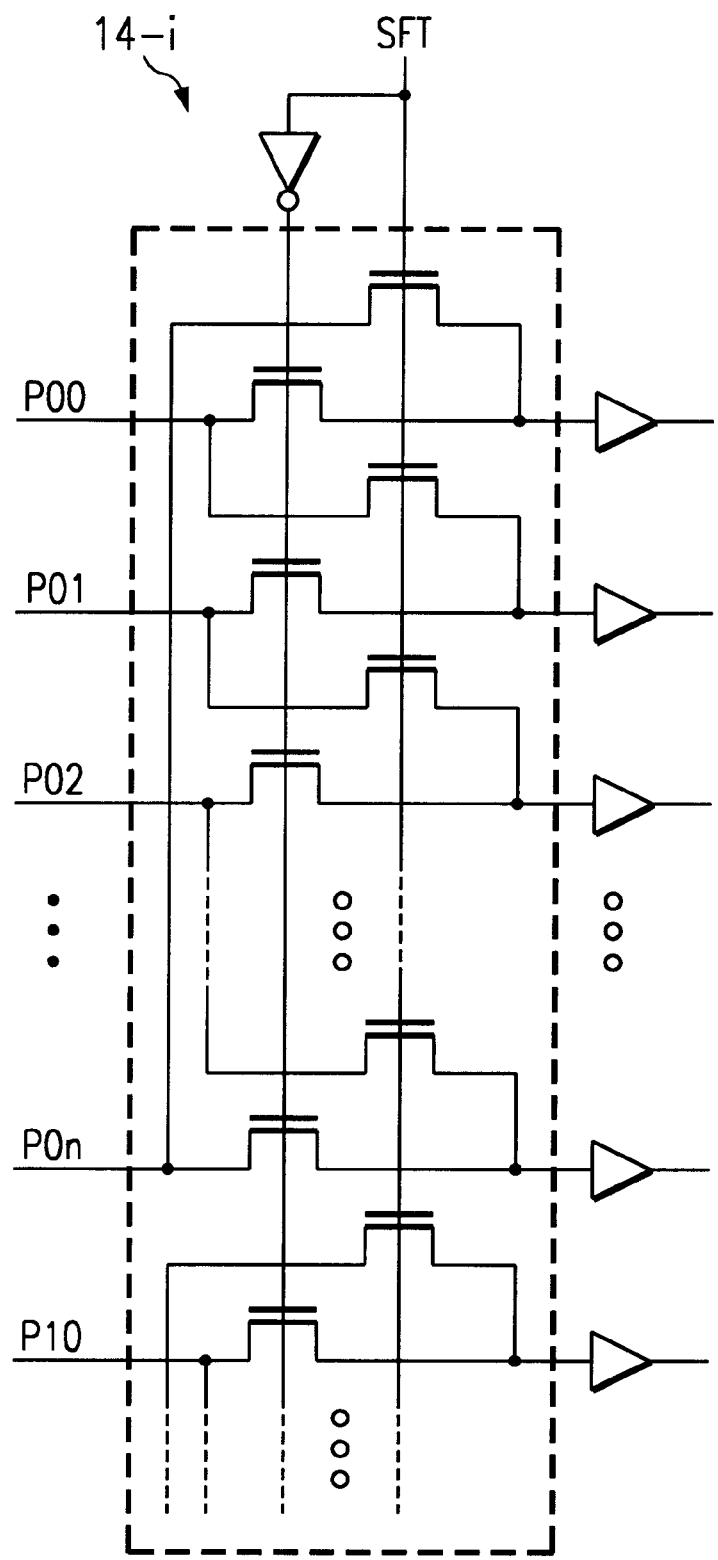
FIG. 4 is a schematic of the address register of the DRAM shown in FIG. 1.

A concrete circuit construction of the address shifter (14-i) (i=1 to 4) is shown in FIG. 4.

As shown in FIG. 4, each address shifter (14-i) has a signal input and a signal output corresponding to the word line for the memory array (15-i); when the input shift signal (SFT) (SFT00 to SFT10) is 0, each input word line is connected to the output signal for the corresponding address as is. In that case, a page selection signal that selects any of the input pages is output as is as the signal that selects the initial page, and is input to the corresponding memory array (15-i).

Also, when the shift signal (SFT) is 1, each input word line is connected to the output signal of the next corresponding address. Therefore, a selection [sic] page selection signal that selects any of the input pages is shifted to the signal that selects the page following the initial page, and is then output.

In the address shifter 14, in regard to the page selection signal for the sub-block in the rightmost position in the X direction, by being shifted it becomes a circuit so as to access the leftmost sub-block of that column. This is for conducting a suitable process when the access for the diagonal direction has reached the right or lower last edge section of the image data; a detailed explanation is given later in regard to its function and operation.

Also, is shown in FIG. 1, the output of the X address decoder 13 is input in series in the sequence of the fourth address shifter ($14_{-4}$), the third address shifter ($14_{-3}$), the second address shifter ($14_{-2}$), and the first address shifter ($14_{-1}$). Therefore, if any of the word lines selected at any of the address shifters (14-i) is shifted, at later stages of the address shifter ($14_{-(i-1)}$) the signal is input with the selected word line in a shifted state.

In the configuration of this embodiment, one sub-block is constructed by 4×4 pixels; since it is not exposed to more than three pixels, there is actually no need for the fourth address shifter ($14_{-4}$) to function. Because of that, the shift signal for this (SFT11) is grounded.

The first to fourth memory arrays $15_{-1}$ to $15_{-4}$ as previously mentioned are memory arrays in which 4 memory elements are connected to each single word line. The word lines are input to each first to fourth memory array $15_{-1}$ to $15_{-4}$ via the medium of the corresponding first to fourth address shifters $14_{-1}$ to $14_{-4}$.

The first to fourth Y address decoders $16_{-1}$ to $16_{-4}$ are memory arrays that select and output one desired data item from the 16 data read out from the first to fourth memory arrays $15_{-1}$ to $15_{-4}$.

Next, an explanation is given in regard to the case wherein image data are recorded as mentioned above in this type of DRAM 1, along with the operation that accesses that recorded data.

First, as mentioned previously, using the data for one sub-block unit as one lump, since it is written in the same page of the first to fourth memory arrays $15_{-1}$ to $15_{-4}$, the capability of accessing up to 4 data items at high speed in both the X direction and the Y direction using the page mode of the DRAM 1 is possible in the same manner as used until now.

Next, an explanation is given in regard to the operation that accesses these recorded image data in the diagonal direction of the X-Y space.

First, an explanation is given in regard to the access of each data of the diagonal line (D) 0, 0.

Figure 5:
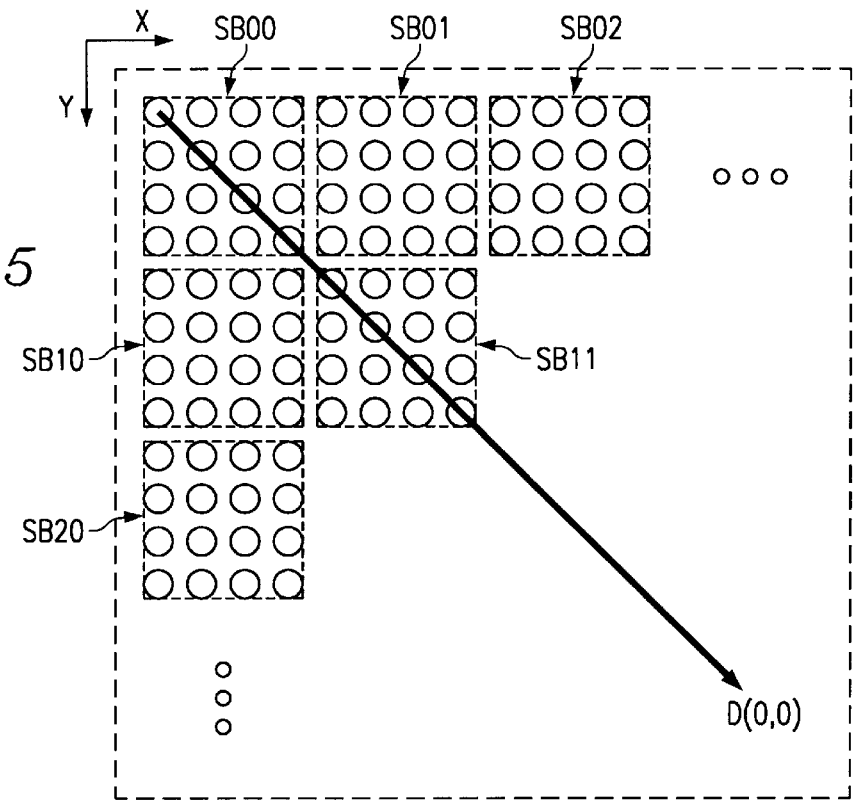
FIG. 5 is a first diagram for explaining the scanning of a diagonal line in the DRAM shown in FIG. 1.

As shown in FIG. 5, the initial 4 data items of the data on the diagonal line (D) 0, 0 are in the sub-block (SB00), the next 4 data items are in the sub-block (SB11), and the following 4 data items are in the sub-block (SB22). [(SB22) is not illustrated.] In other words, in the diagonal line (D) 0, 0, there are 4 data items in one sub-block. Therefore, if page (P00) is accessed a minimum of 4 data items, and if page (P11) is accessed the following 4 data items, are read out to the page buffer. In this case, these as in the case of data accessing the X direction and Y direction, [the data] can be accessed at high speed 4 items at a time in a one-time access even if a special scheme is not executed.

In regard to a diagonal line such that the apex at the upper left of each sub-block becomes the start, such as diagonal lines (D) 3, 0 and (D) 7, 0, in the same manner as with the diagonal line (D) 0, 0, high-speed access can be performed 4 items at a time with a one time access.

Next, an explanation is given in regard to the excess of each data of the diagonal line (D) 1, 0.

Figure 6:
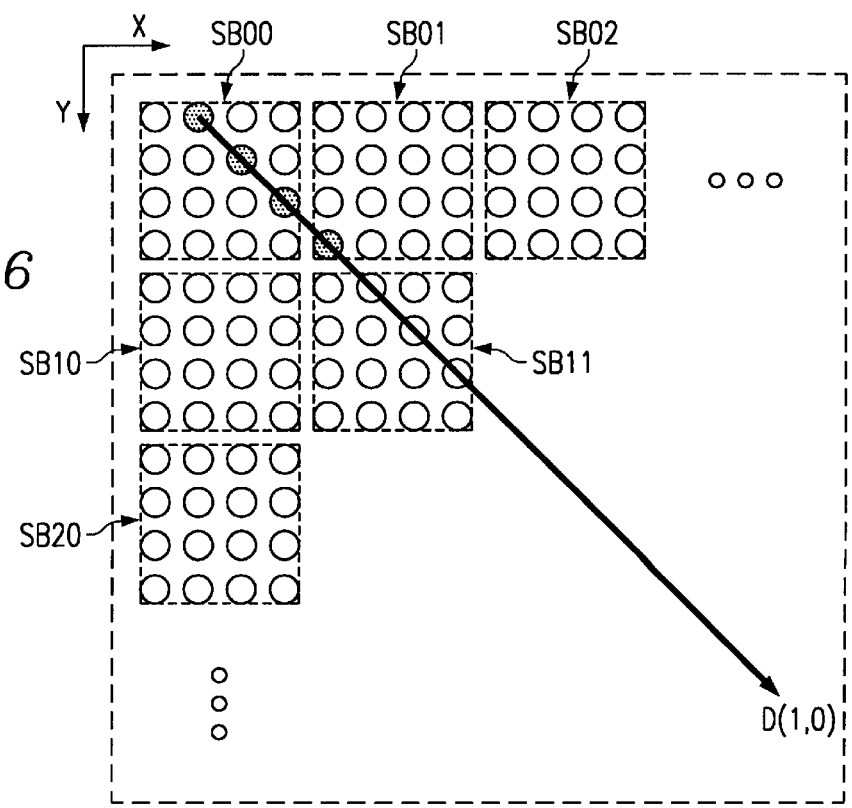
FIG. 6 is a second diagram for explaining the scanning of a diagonal line in the DRAM shown in FIG. 1.

As for the access of data on the diagonal line (D) 1, 0, as shown in FIG. 6, the initial 3 data items are in the sub-block (SB00), but the next data is in the sub-block (SB01). Therefore, because a minimum of 3 data items are on page (P00), the second to fourth memory arrays $15_{-2}$ to $15_{-4}$ are accessed, and these are read out to the page buffer. The remaining 1 data item is in the sub-block (SB01). Therefore, at the first memory array ($15_{-1}$), page (P01) must be accessed.

Thus, only the shift signal (SFT00) is made 1. The page address (P00) from an external section is applied to all of the memory arrays. Because the shift signals (SFT01, SFT10, SFT11) are 0, except for the first memory array $15_{-1}$ at the other three memory arrays, the external page address (P00) is accepted as the internal page address for the respective memory arrays as is, and the data that are at those page positions are read out to the page buffer. Because the shift signal (SFT00) is 1, the internal page address of the first memory array $15_{-1}$, is shifted by one address, and the data at the position of the page (P01) are read out to the page buffer. Therefore, the reading out of the 4 data items, such as shown by the black circles in FIG. 6, to the page buffer of the DRAM can be done with a one-time access of the DRAM memory array.

Figure 7:
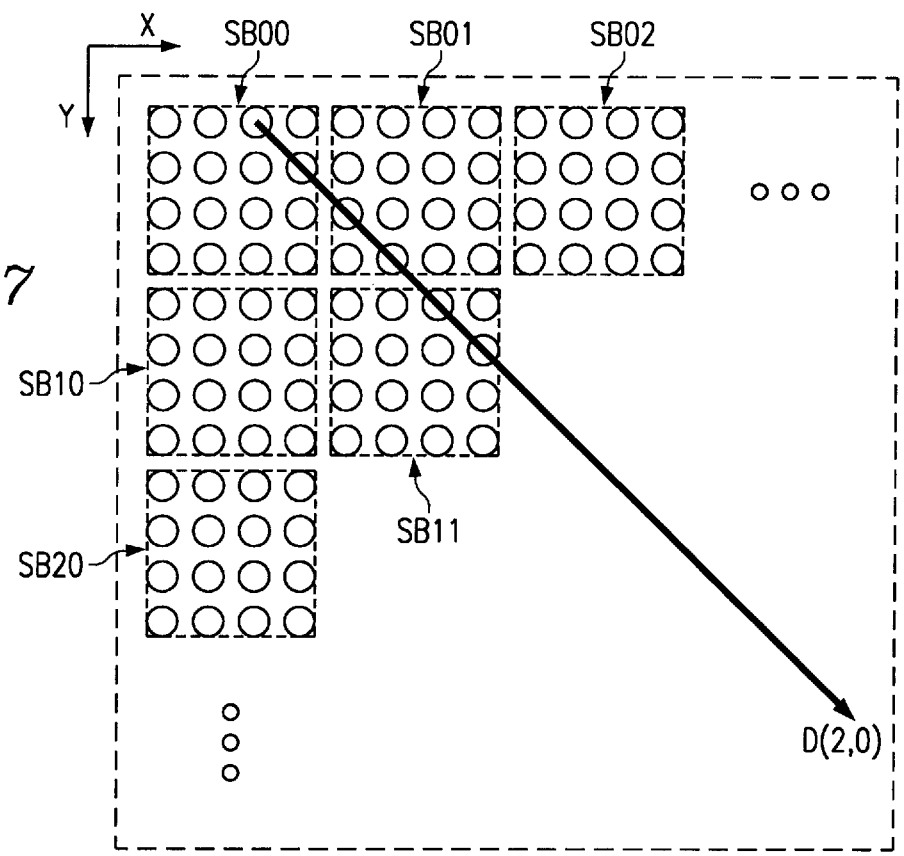
FIG. 7 is a third diagram for explaining the scanning of a diagonal line in the DRAM shown in FIG. 1.

In the case of accessing the data on diagonal line (D) 2, 0, as shown in FIG. 7, the initial 2 data items are in the sub-block (SB00), and the next 2 data items are in the sub-block (SB01). Therefore, if the shift signal (SFT01) is made 1, the page addresses of the first memory array $15_{-1}$, and the second memory array $15_{-2}$ are shifted by one address, and the desired 4 data items can be output.

In the same manner, as for the data on the diagonal line (D) 3, 0, since the initial 1 data item is in the sub-block (SB00) and the next 3 data items are in the sub-block (SB01), the shift signal (SFT10) can be made 1.

Next, an explanation is given in regard to the access of the data close to the end of the diagonal line.

In this case, it is basically the same as the above-mentioned method, but the page address is not shifted by only one address and comes to be shifted to the leading address of the same column.

Figure 8A:
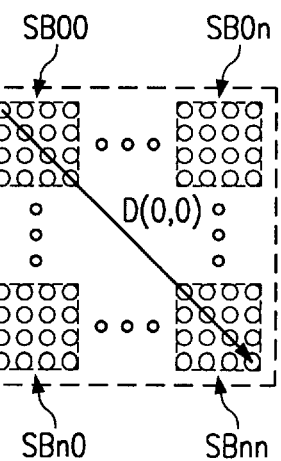
FIG. 8 is a diagram for explaining the scanning of the vicinity of the final edge of a diagonal line and the DRAM shown in FIG. 1.

As shown in FIG. 8(A), the final 4 data items on the diagonal line (D) 0, 0 are in the sub-block (SBnn). Therefore, if page (Pnn) is accessed, these 4 data items can be read out to the page buffer with a one-time access of the DRAM memory array.

Figure 8B:
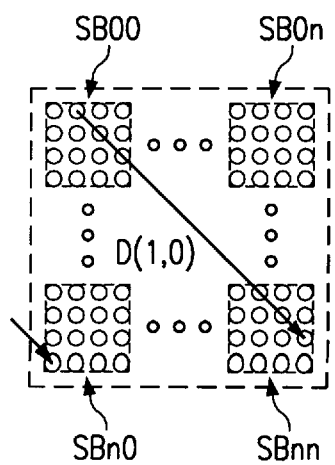

In the case of the diagonal line (D) 1, 0, as shown in FIG. 8(B), of the final 4 data items, 3 are in the sub-block (SBnn) and the remaining 1 is in the sub-block comparing (SB0n). As shown in FIG. 4, at the address shifter (14-i) (i=1 to 4), due to the page address that accesses the rightmost sub-block of the X direction being shifted, it becomes a circuit so as to access the leftmost sub-block of that column. Therefore, at the first memory array ($15_{-1}$), when the page (Pnn) is applied from an external section, by making the shift signal (SFT00) 1, the page (Pn0) can be selected; as a result, the 1 data item of the end can be appropriately obtained.

Figure 8C:
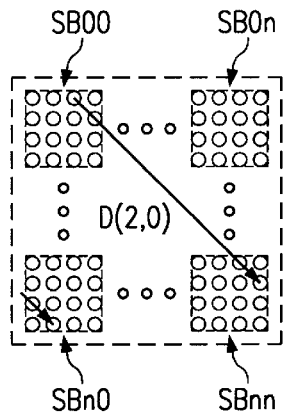
Figure 8D:
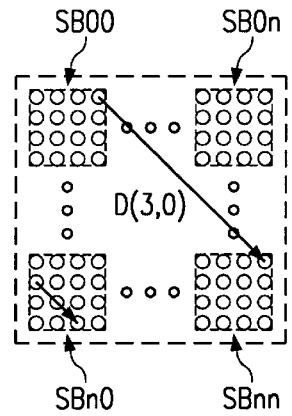

In the same manner, in the case of the diagonal line (D) 2, 0 such as that shown in FIG. 8(C), and also in the case of the diagonal line (D) 3, 0 shown in FIG. 8(D), the diagonal line that reaches the right edge of the image data is appropriately connected to the left edge of that column, and the desired data can be obtained.

In this way, according to the DRAM 1 of the configuration of this embodiment, even in the event the two-dimensional data items were scanned in the diagonal direction using an optional pixel as the starting point, the pixel data can be read out at high speed in the same manner as a simple access in the X direction and the Y direction. As a result, processes such as applying an ECC code to the image data using an access in the diagonal direction can be conducted at high speed.

The semiconductor memory device of this invention is not limited to this embodiment, and various changes are possible.

For example, in the configuration of this embodiment, the image data are divided into sub-blocks of 4×4; this was made so as to be stored in a single page, but the size of this sub-block can also be 5×5 or 8×8. In that case, the memory, which can shift the address independently by means of the shift signal, is [made] so that the division number, in other words the provision of 5 units or 8 units, is appropriate.

Figure 9:
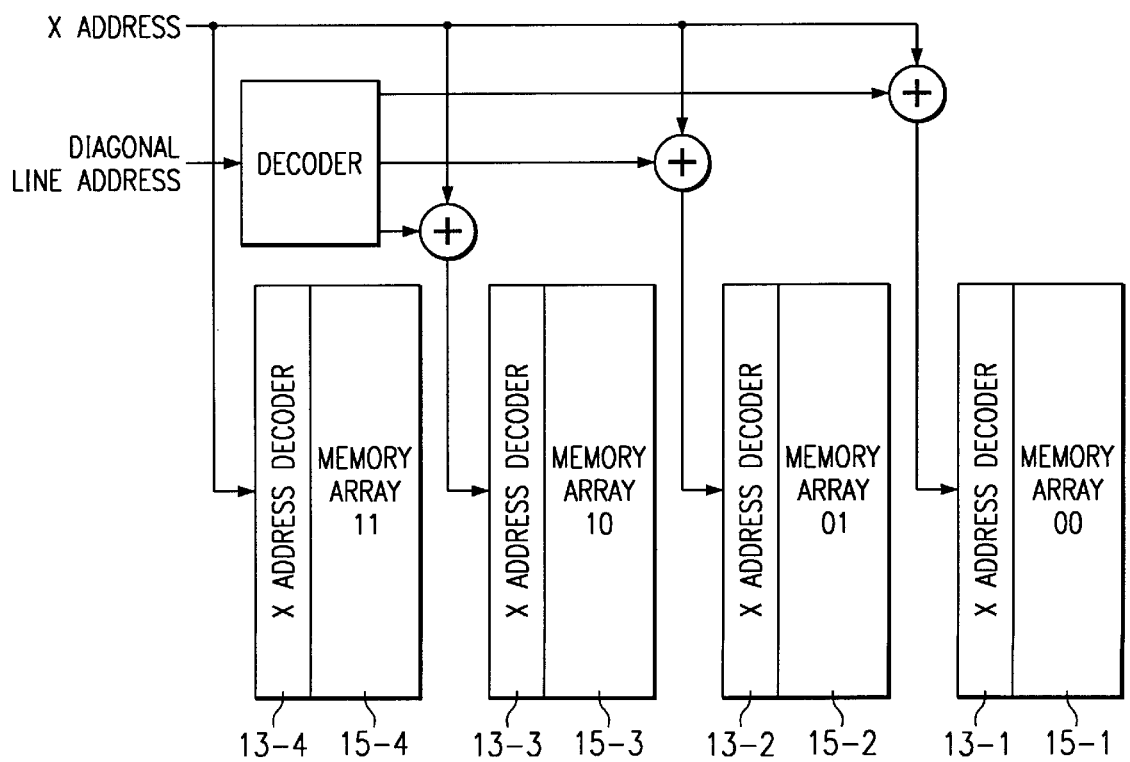
FIG. 9 is a diagram showing a modified example of the configuration of one embodiment of this invention shown in FIG. 1.
Figure 10:
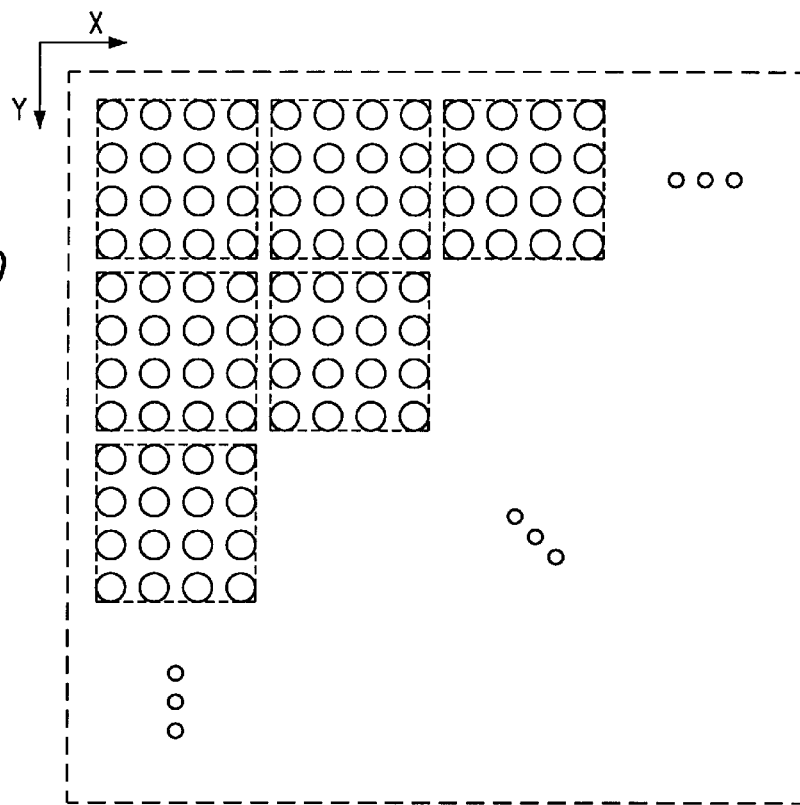
FIG. 10 is a diagram for explaining the storage method for image data in a semiconductor memory device used in the past.
Figure 11:
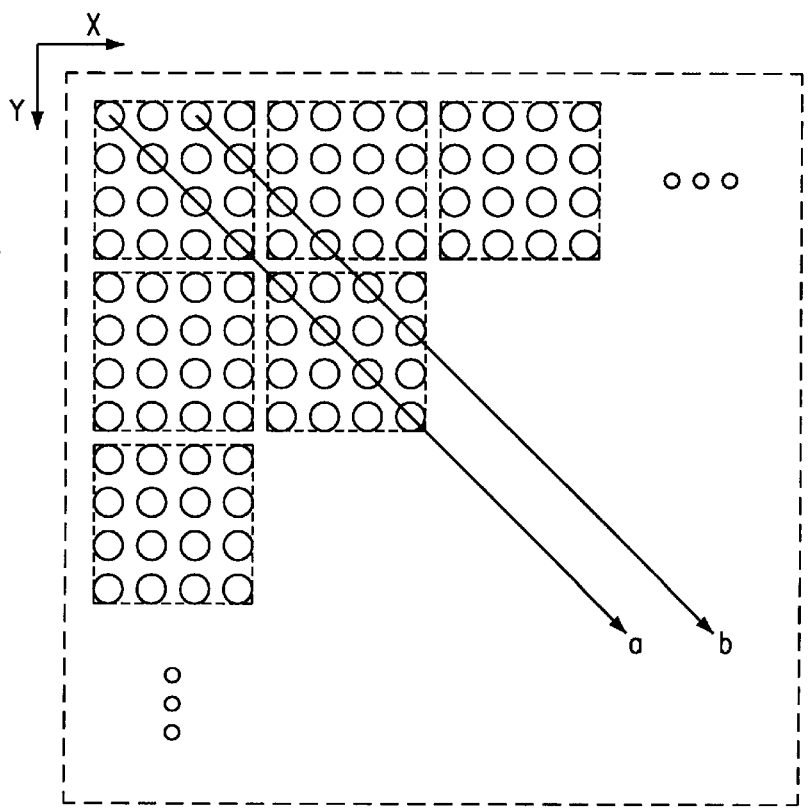
FIG. 11 is a diagram showing the configuration that reads out image data (in the diagonal direction) that was stored in a semiconductor memory device used in the past.

Also, in the configuration of this embodiment, the input X address was decoded with a single X address decoder, and the page selection signals generated here were shifted by the first to fourth address shifters $14_{-1}$ to $14_{-4}$, respectively, generating the page selection signals input to each of the first to fourth memory arrays $15_{-1}$ to $15_{-4}$. However, for example, as shown in FIG. 9, it can be made so as to independently provide the four X address decoders $13_{-1}$ to $13_{-4}$, respectively, corresponding to the first to fourth memory arrays $15_{-1}$ to $15_{-4}$ and can, based on the page address and diagonal line address that are input from an external source, directly generate the respective page selection signals at each X address decoder (13-i) (i=1 to 4).

As for the semiconductor memory device of this invention, because two or more different internal addresses are generated in response to the scanning data from a single address applied from an external section, by that means, regardless of the scanning method, the desired data are always accessed in exactly the prescribed number and a generating means for internal addresses that are actually different can be realized with an optional means.

Also, in the configuration of this embodiment, it was made to write-in the sub-blocks aligned in the X direction in sequence to consecutive pages, but it can also write-in the sub-blocks that are aligned in one column in the Y direction to consecutive pages.

Also, in the DRAM 1 of the configuration of this embodiment, the first to fourth address shifters ($14_{-1}$ to $14_{-4}$) are provided corresponding to the first to fourth memory arrays ($15_{-1}$ to $15_{-4}$), but as was mentioned previously since there is no shifting of four columns, the fourth address shifter ($14_{-4}$) is actually not necessary. Therefore, there is no hindrance even if it is a construction that eliminates such.

Also, in the configuration of this embodiment, an explanation was given using a single data item as being the data of 1 bit, but a single data item itself referred to in the configuration of this embodiment can be, for example, data of 4 bits or data of 8 bits. In the case of recording the ordinary multilevel image data, such a type of construction is appropriate. Also, even when making it so as to record that type of multilevel image data by aligning multiple DRAMs with a 1-bit construction, it is clear that this is within the scope of the invention.

Also, in the configuration of this embodiment, it was explained by the use of a device in which all of the circuits were carried on the same chip, but using multiple chips it can also construct circuits that realize this type of remapping of the addresses.

Lastly, if two circuits are provided for the configuration of this embodiment and are made to operate alternately in a pipeline system, the data can be accessed without intermission, which is ideal. It can thus be made this type of construction.

As was explained above, according to the semiconductor memory device of this invention, data can be accessed at high speed and with good efficiency in the X direction, the Y direction, and the direction of a diagonal line. As a result, it can offer an appropriate semiconductor memory device, using it, for example, in a process applying ECC codes to image data and the like.

What is claimed is:

1. A semiconductor memory device comprising:
  a plurality of N memory arrays, each having a predetermined number of pages in which storage elements are arranged that enable the storage of essentially M units of data for one page address, where M and N are whole numbers,
  a page selecting means for selecting, based on prescribed shift information that is input, a page showing the page address that is input at each of the N units of memory array, or any one of said page addresses and a page separated from the prescribed address, and makes the page for the corresponding memory array effective;
  and a data selecting means for selecting the page that was made effective for the above-mentioned N units of memory is output, and which selects the desired data from M units times N units of data that are stored in said page.

2. A semiconductor memory device of claim 1 wherein:
  the page selecting means comprises
    a decoder that decodes the input page address, and makes effective the word line that makes the page showing said address effective, and
    word line shift means that are respectively provided for optional memory arrays of the N units of memory arrays and which, based on the input prescribed shift information, shifts the above-mentioned effective word line to the word line that makes the previous page effective or following the address.

3. A semiconductor memory device comprising:
  a plurality of N memory arrays, each having a prescribed number of pages in which storage elements are arranged and that enable the storage of essentially M units of data for a single page address, with the data having a two-dimensional construction and being divided into sub-blocks having a two-dimensional construction and having M units times N units of data, where M and N are whole numbers, the sub-blocks connected in a first direction being sequentially stored in the pages in which the addresses are consecutive, and for each sub-block, with M units of column data that are consecutive in the second direction becoming the same page of the same array, the N units of the column data becoming the page for the same address for N units of a memory array, and the column data of the same position of each sub-block being stored so as to become the same memory array;
  a page selection means for selecting, based on the information related to an address showing the desired data that was input, as well as the desired diagonal line of the scanning object that was input, a page having the data of the sub-block containing the desired data at each of the N units of memory array so as to make the data contained in the desired diagonal line N units selectable, for either of the pages preceding or following said page; making said page of each of the memory arrays effective; and
  a data selection means for selecting N units of data contained in the desired diagonal line from M units times N units of data stored in said pages that were output from the page of the N units of memory array that was made effective.

4. A semiconductor memory device of claim 3 wherein the M number of data of the second direction of the sub-block is the same as the N number of data of the first direction, and the optional two-dimensional data are stored, with the data for each N unit being accessible in the page mode even in the diagonal direction.

5. A semiconductor memory device comprising:
  a plurality of memory arrays having an x and y address for each data location in each array, and each array having a prescribed number of pages in which storage elements are arranged, an x address shifter associated with each memory array for holding an x address, an x address buffer which supplies an address to each x address shifter, a y address decoder coupled to each array, a diagonal line address buffer which receives a diagonal line address input signal and outputs a y address to each y address decoder and outputs a plurality of diagonal line address bits, a decoder for receiving the diagonal line address bits to output a shift signal to each x address shifter.

6. A semiconductor memory device of claim 5 wherein the shift signal to each x address shifter activates one or more address shifters to shift the x address of one or more arrays to an adjacent page compared to the page address stored in an x address shifters that is not activated.

7. A semiconductor memory device of claim 6 wherein one or more x addresses are shifted to address an adjacent page such that data in a diagonal line in a two dimensional data space is effectively accessed as a single page.

* * * * *